United States Patent
Li et al.

(10) Patent No.: US 8,113,710 B2
(45) Date of Patent: Feb. 14, 2012

(54) LOCKING DEVICE FOR RELIABLY SECURING A TEMPERATURE SENSOR ON A HEAT SINK

(75) Inventors: Wei Li, Shenzhen (CN); Yi-Qiang Wu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 794 days.

(21) Appl. No.: 12/202,392

(22) Filed: Sep. 1, 2008

(65) Prior Publication Data

US 2009/0232186 A1    Sep. 17, 2009

(30) Foreign Application Priority Data

Mar. 14, 2008   (CN) .......................... 2008 1 0065849

(51) Int. Cl.
*G01K 1/14*    (2006.01)
(52) U.S. Cl. ....................................... 374/208; 439/331
(58) Field of Classification Search .................. 374/208, 374/120, 147, 29, 170, 43–44, 141, 194; 165/104.33, 80.2; 361/679.46, 700, 704; 439/331; 24/258
See application file for complete search history.

(56) References Cited

U.S. PATENT DOCUMENTS

| | | | | |
|---|---|---|---|---|
| 5,357,404 A | * | 10/1994 | Bright et al. | 361/818 |
| 5,424,918 A | * | 6/1995 | Felps et al. | 361/704 |
| 5,454,641 A | * | 10/1995 | Parker et al. | 374/120 |
| 5,684,676 A | * | 11/1997 | Lin | 361/704 |
| 5,761,036 A | * | 6/1998 | Hopfer et al. | 361/704 |
| 6,547,580 B1 | * | 4/2003 | Leavitt et al. | 439/266 |
| 6,557,625 B1 | * | 5/2003 | Ma | 165/80.2 |
| 6,741,089 B2 | * | 5/2004 | Conroy | 324/750.06 |
| 6,766,993 B2 | * | 7/2004 | Rasmussen et al. | 248/313 |
| 6,814,486 B2 | * | 11/2004 | Sidoni | 374/208 |
| 7,133,726 B1 | * | 11/2006 | Atwood et al. | 700/1 |
| 7,193,854 B2 | * | 3/2007 | Bonomo et al. | 361/719 |
| 7,597,472 B2 | * | 10/2009 | Hang et al. | 374/208 |

* cited by examiner

*Primary Examiner* — Lisa Caputo
*Assistant Examiner* — Tania Courson
(74) *Attorney, Agent, or Firm* — Altis Law Group, Inc.

(57) ABSTRACT

A locking device for securing a temperature sensor on a heat sink, includes a support seat and a catch fixed to the heat sink and respectively located at two opposite sides of the sensor, and a tab connecting with the support seat and the catch and pressing the sensor against the heat sink downwardly. The support seat includes a bent sheet secured on the heat sink and a pair of rings. The catch includes a bent flake secured on the heat sink and a barb extending downwardly from the flake. An end of the tab is bent to form a hem pivotably connected to the support seat at a position between the rings. An opposite end of the tab defines an opening, which engages the barb therein to thereby lock with the catch.

18 Claims, 6 Drawing Sheets

LOCKING DEVICE FOR RELIABLY SECURING A TEMPERATURE SENSOR ON A HEAT SINK

BACKGROUND OF THE INVENTION

1. Field of the Invention

The present invention relates to a locking device, and more particularly to a locking device which can reliably secure a temperature sensor on a heat sink.

2. Description of Related Art

The central processing unit (CPU) mounted on the motherboard in a computer is the core of operations of the computer. During the operation of the computer, the CPU produces a large number of heat. The heat must be quickly carried away from the CPU during the operation of the computer, since excessively high temperature would cause the CPU to work abnormally. Therefore, a heat sink is required to be mounted on the CPU to dissipate heat therefrom.

For more effectively carrying heat from the CPU, a fan is mounted near the CPU to blow the heat sink. Considering a save of energy, a temperature sensor is provided in electrical connection with the fan. The sensor can determine a real-time temperature of the CPU, and generate a signal with a value associated with the real-time temperature of the CPU. The signal is then received by the fan so that the fan can rotate at a suitable speed.

The sensor is secured on the heat sink adjacent to the CPU as near as possible, for precisely obtaining the real-time temperature of the CPU. A typical method to secure the sensor on the heat sink is using heat-conductive glue, which bonds the sensor and the heat sink together.

However, owing to an aging material characteristic, a viscous force generated by the glue is prone to be weaken when the glue has being used for a long period; that is to say, the glue is unable to firmly bond the heat sink with the sensor after a period of use. With the decrease of the viscous force, the sensor would fall off from the heat sink under a gravity force, and thus cannot input the signal to the fan with the value reflecting a real temperature of the CPU.

What is needed, therefore, is a locking device which can overcome the above-mentioned disadvantages.

SUMMARY OF THE INVENTION

A locking device for securing a temperature sensor on a heat sink, includes a support seat and a catch fixed to the heat sink and respectively located at two opposite sides of the sensor, and a tab connected with the support seat and the catch to press the sensor against the heat sink downwardly. The support seat includes a bended sheet standing on the heat sink and a pair of rings extending curvedly from the sheet. The catch includes a flake set on the heat sink and a barb extending downwardly from the flake. An end of the tab is bent to form a hem received between the rings. A pin extends through the hem and the rings to pivotably connect the tab to the support seat. An opposite end of the tab defines an opening, which engages the barb therein to thereby lock the tab with the catch. The present invention further provides a locking device with another configuration, which is made integrally. The another locking device includes a tab pressing the sensor and a pair of wings extending outwardly from two opposite ends of the tab and secured on the heat sink. Under the pressure exerted by the tab, the sensor can firmly contact with the heat sink without being loosened or even falling off from the heat sink, even if a thermal adhesive for bonding the sensor on the heat sink loses its original adhering force due to aging. Accordingly, a continuous and reliable determination on the real-time temperature of a CPU in contact with the heat sink can be ensured by the sensor.

Other advantages and novel features of the present invention will become more apparent from the following detailed description when taken in conjunction with the accompanying drawings.

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
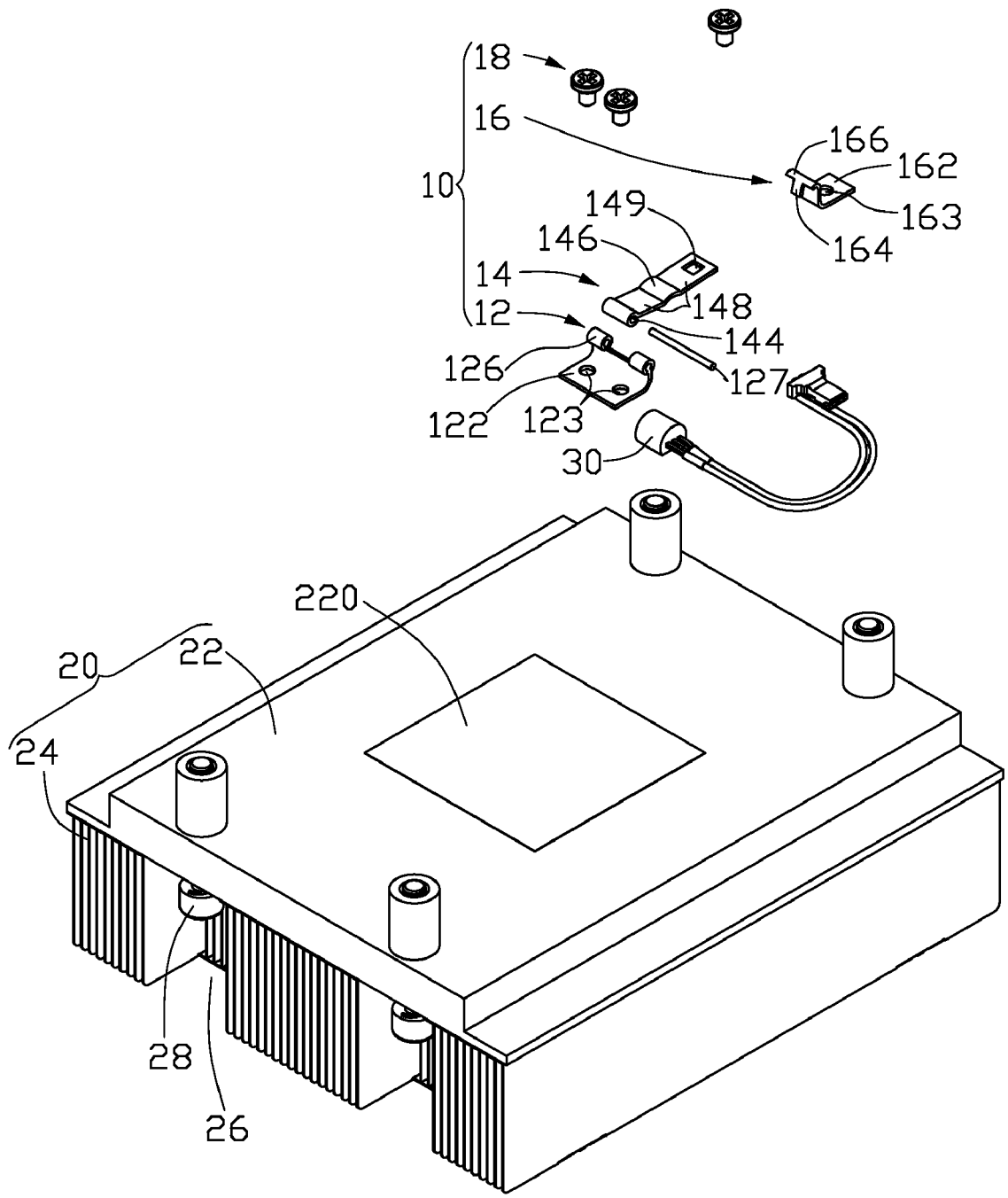
FIG. 1 is an exploded, perspective view of a locking device in accordance with a first embodiment of the present invention, wherein a heat sink and a sensor are located near the locking device.

As shown in FIG. 1, a locking device 10 in accordance with a first embodiment of the present invention is used to secure a temperature sensor 30 on a heat sink 20. The heat sink 20 comprises a rectangular base 22 and a plurality of fins 24 extending downwardly and perpendicularly from a bottom face of the base 22. A top face of the base 22 has a square central area 220 spread with a thermal interface material (not shown), such as grease or glue. The thermal interface material is used for bonding the central area 220 of the base 22 on an electronic component such as a CPU (not shown) which needs to be cooled, thus transferring heat from the electronic component to the base 22 more effectively. A pair of cutouts 26 are defined at each lateral side of the fins 24, for allowing screws 28 through the base 22 without interfering with the fins 24, thereby fixing the heat sink 20 on a printed circuit board (not shown) on which the electronic component is mounted.

The sensor 30 is situated on the heat sink 20 in vicinity of the central area 220 of the top face of the base 22. The sensor has a flat surface contacting with the top face of the base 22, and an arced surface opposite to the flat surface thereof. The sensor 30 is readily fixed on the heat sink 20 by adhering the flat surface thereof on the top face of the base 22 via a thermal adhesive (not shown). The sensor 30 can deliver a corresponding signal into a fan (not shown) located near the heat sink 20, by determining a real-time temperature of the electronic component, thus adjusting a rotation speed of the fan.

The locking device 10 consists of a support seat 12 and a catch 16 laying on the top face of the base 22, a resilient tab 14 pivotably fixed to the support seat 12, and three screws 18 fixing the support seat 12 and the catch 16 on the heat sink 20. The support seat 12 includes a bent sheet 122 located at a lateral side of the sensor 30 and a pair of rings 126 extending curvedly from the sheet 122. The sheet 122 has a lower part (not labeled) horizontally engaging the top face of the base 22, and an upper part (not labeled) bended upwardly and vertically from the lower part. A pair of holes 123 are defined in the lower part of the sheet 122 for extension of two screws 18 therethrough. The pair of rings 126 are extended from a top end of the upper part of the sheet 122, and each of which is so curved that each ring 126 encloses a column-shaped aperture (not labeled) therein. A gap (not labeled) is formed between the pair of rings 126, for receiving the tab 14 therein.

Figure 2:
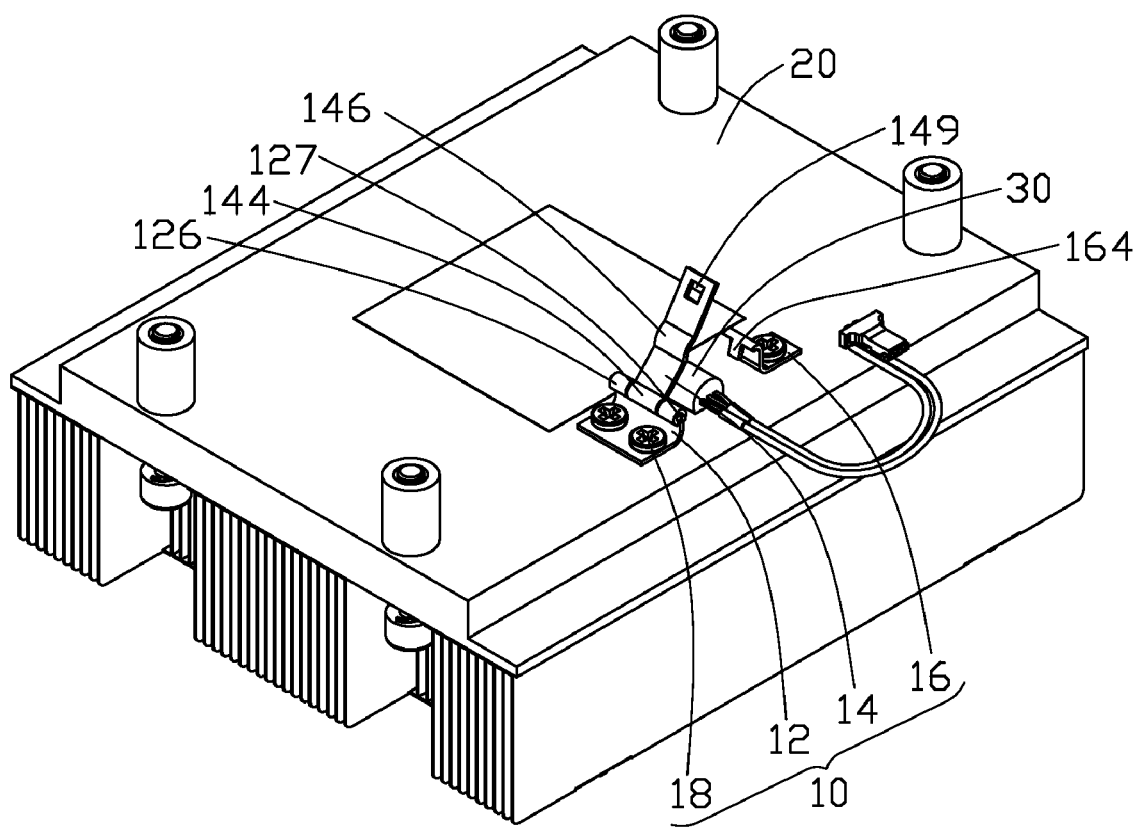
FIG. 2 is an assembled view of FIG. 1, wherein the locking device is in a released position.

Also shown in FIG. 2, the catch 16 is located at an opposite lateral side of the sensor 30, and comprises a flake 162 and a barb 164 extending downwardly from the flake 162. The flake 162 is bended to form a horizontal section (not labeled) in direct connection with the top face of the base 22, and an upright section (not labeled) coupling with the barb 164. A through hole 163 is defined in the horizontal section of the flake 162 for allowing one screw 18 therethrough. The barb 164 is extended downwardly and inclinedly toward the sensor 30 from a top end of the upright section of the flake 162, for locking with the tab 14. An arced joint 166 is formed between the upright section of the flake 162 and the barb 164, thus interconnecting the flake 162 and the barb 164 and providing resilience to the barb 164.

Figure 3:
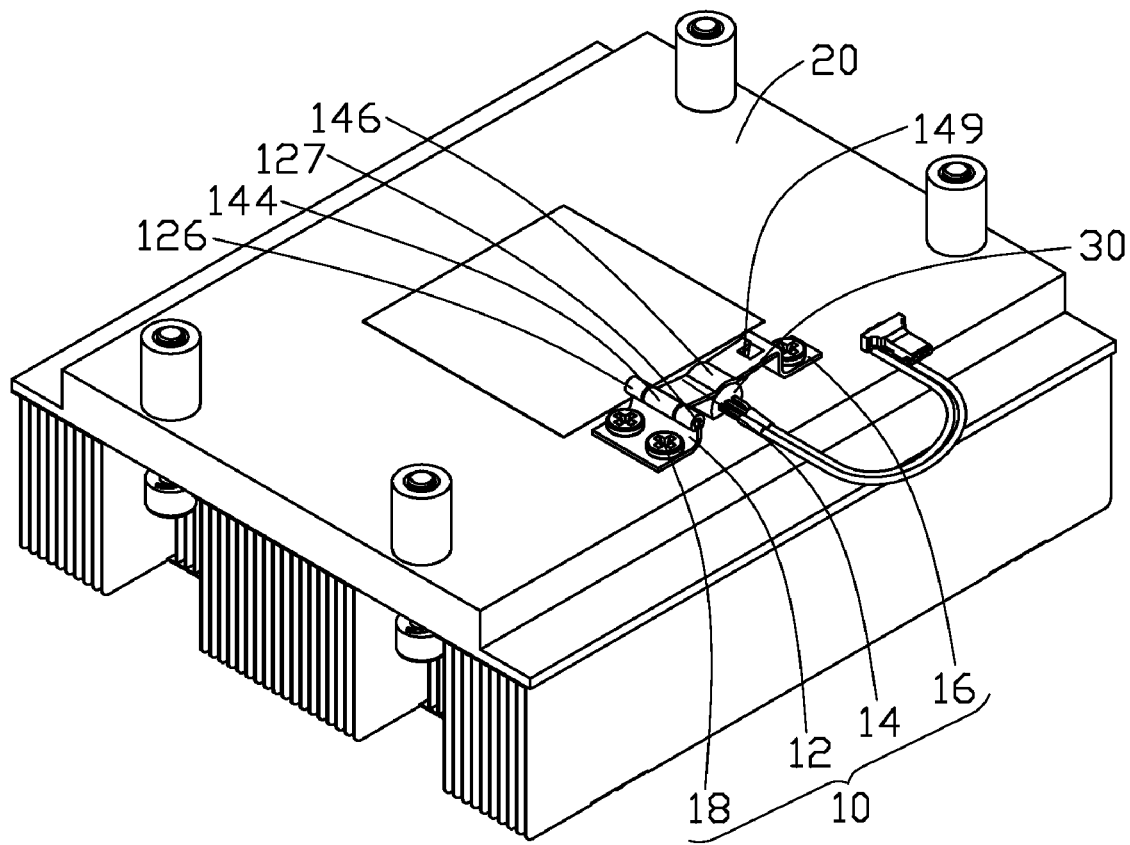
FIG. 3 is view similar to FIG. 2, wherein the locking device is in a locked position.

As illustrated in FIGS. 1-3, the tab 14 is located between the support seat 12 and the catch 16 and spans across the sensor 30 (as viewed from FIG. 3). The tab 14 comprises a baffle 146, a pair of arms 148 extending slantwise from two opposite sides of the baffle 146, and a hem 144 curved downwardly from one of the pair of arms 148 near the support seat 12. The baffle 146 is configured to have an arced shape conforming a top part of the curved surface of the sensor 30, to insure a tight contact between the sensor 30 and the tab 14. The pair of arms 148 are extended approximately horizontally and bended along a slightly upward direction, for producing resilient forces when the tab 14 locked to the catch 16. The resilient force can press the sensor 30 against the heat sink 20 with a considerable amount of force, thus realizing a reliable and firm connecting between the sensor 30 and the heat sink 20. The hem 144 is curved from an outmost end of the one of the pair of arms 148 near the support seat 12. The hem 144 has a configuration similar to that of the ring 126 of the support seat 12, for extending a pin 127 therethrough which also extends through the pair of rings 126 of the support seat 10, thereby pivotedly fixing the tab 14 with the support seat 12. Another one of the pair of arms 148 near the catch 16 forms a square opening 149 defined in an outmost end thereof. The opening 149 is employed to engage the barb 164 of the catch 16 therein, thereby locking the tab 14 to the catch 16.

In assembly, the sensor 30 is readily attached on the heat sink 20 by adhering the flat surface thereof to the top face of the base 22. The support seat 12 is fixed to the heat sink 20 at the lateral side of the sensor 30 by fastening the two screws 18 through the two holes 123 of the support seat 12 into the base 22, and the catch 16 is secured to the heat sink 20 at the opposite lateral side of the sensor 30 by fastening the one screw 18 though the hole 163 of the catch 16 into the base 22. The tab 14 is brought to engage with the support seat 12 in a manner that the hem 144 thereof is fittingly received between and located in alignment with the pair of rings 126 of the support seat 12. The pin 127 is inserted through the hem 144 and the pair of rings 126 to pivotedly joint the tab 14 with the support seat 12.

Figure 4:
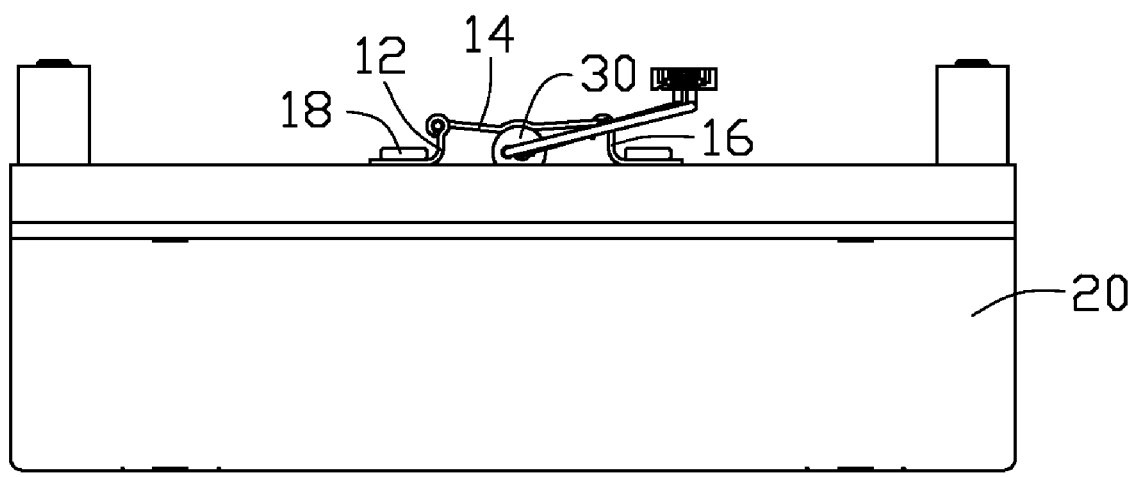
FIG. 4 is a side view of FIG. 3.

Also referring to FIG. 4, in use, the tab 14 is rotated downwardly until the barb 164 of the catch 16 interferentially engages in the opening 149 in the outer end of the another one of the pair of arms 148. During the downwards rotation of the tab, the barb 164 is pressed to be resiliently deformed toward the flake 162 by the tab 14. Until the tab 14 is pivoted to an approximately horizontal orientation, the barb 164 is securely clasped in the opening 149 in the tab 14 to thereby realize a firm locking between the tab 14 and the catch 16. In this way, the baffle 146 presses the sensor 30 against the heat sink 20 downwardly to thereby achieve an intimate contact between the sensor 30 and the heat sink 20.

Figure 5:
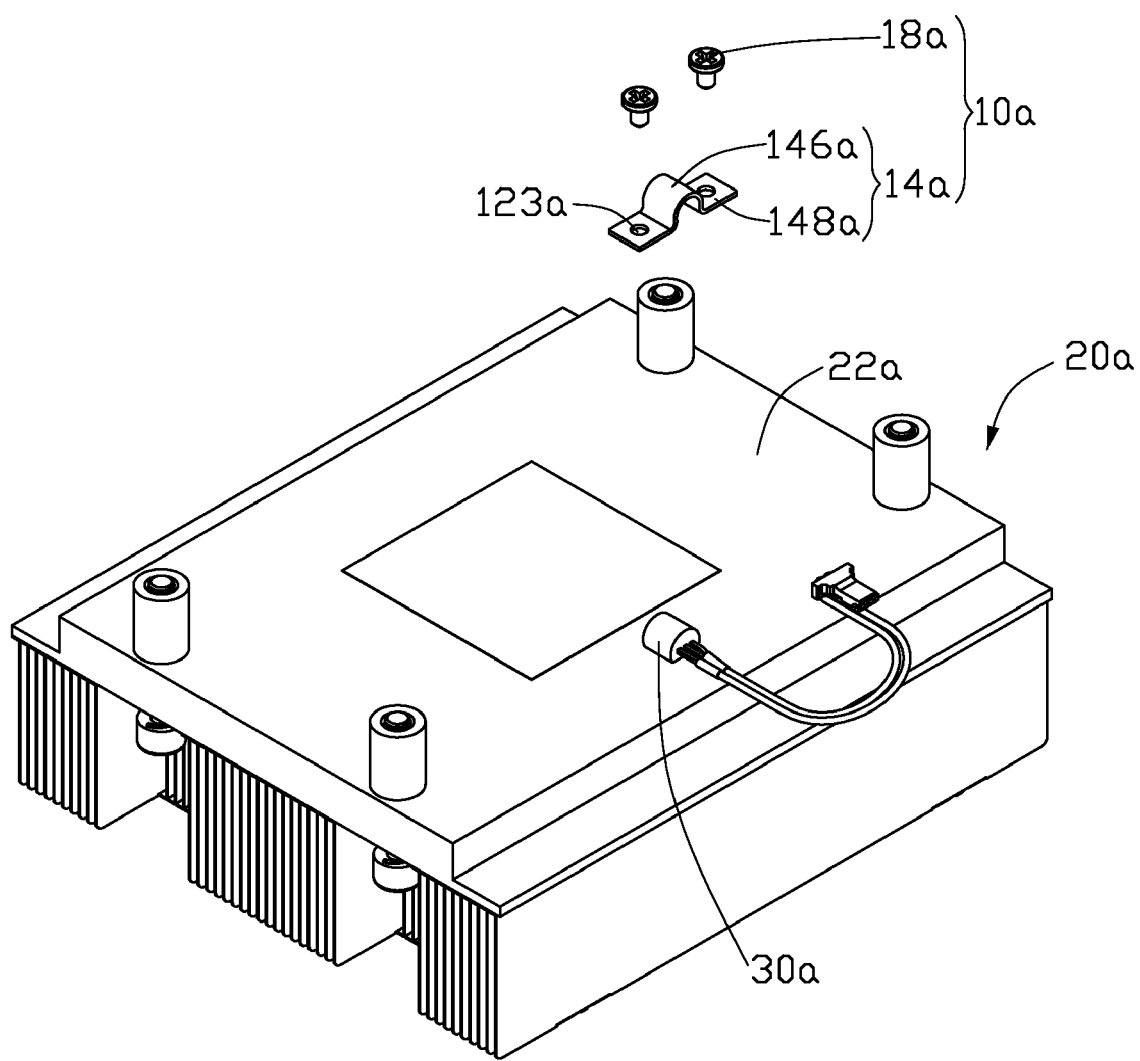
FIG. 5 is an exploded, perspective view of a locking device in according with a second embodiment of the present invention, with a heat sink and a sensor located near the locking device.
Figure 6:
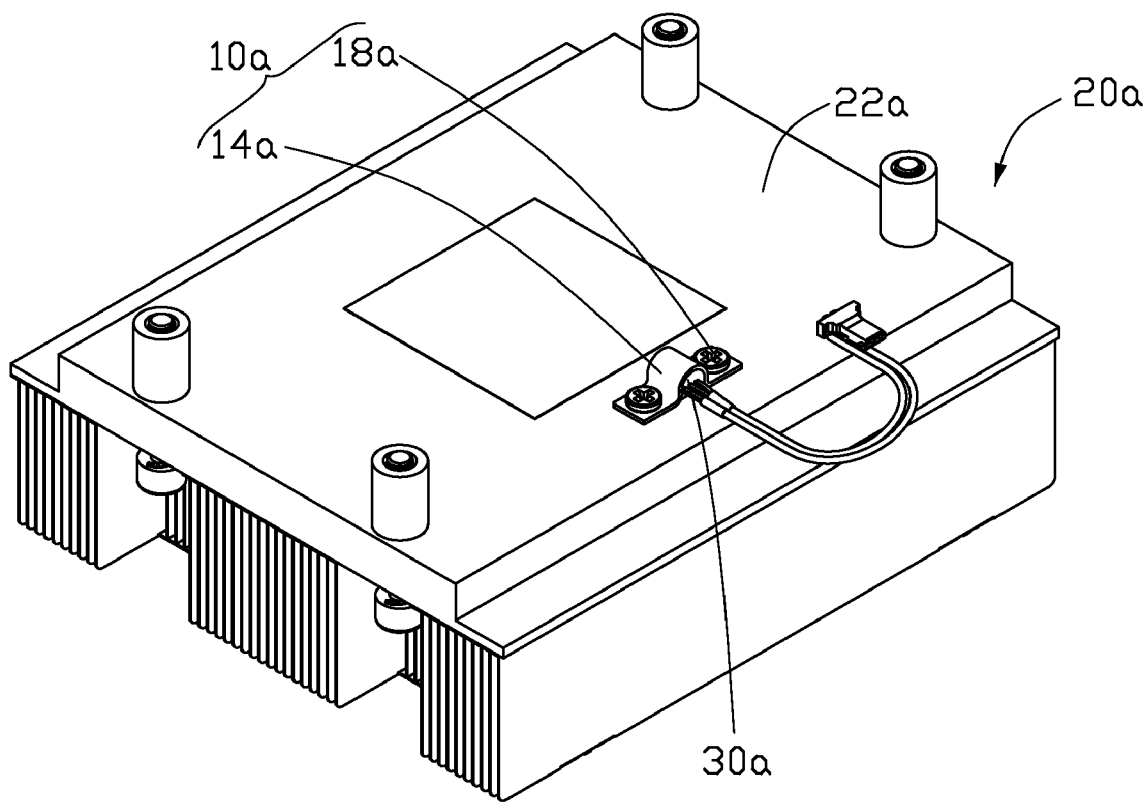
FIG. 6 is an assembled view of FIG. 5.

Note that the locking device 10 of the first embodiment can be varied to include a much simpler configuration, for relieving a complexity thereof which needs many components and a laborious work to install the locking device 10. Such locking device 10a with the simpler configuration is shown in FIGS. 5-6. The locking device 10a in accordance with a second embodiment is made integrally and comprises an abutting element 14a for holding the sensor 30a on the heat sink 20a, and a pair of fasteners 18a for fixing the abutting element 14a on the heat sink 20a. The abutting element 14a includes a curved tab 146a and a pair of wings 148a extending outwardly from two opposite lateral sides of the tab 146a. The tab 146a is so curved that it has an inner surface conforming the arced surface of the sensor 30a, whereby the tab 146a can tightly enclose the sensor 30a therein when the tab presses the sensor 30a against the heat sink 20a. The pair of wings 148a are rectangular and planar and each of which defines a hole 123a therein. The two fasteners 18a are respectively extended through the holes 123a in the two wings 148a and into the base 22a of the heat sink 20a, thus securing the sensor 30a on the heat sink 20a firmly.

Under the pressure generated by the locking device 10, 10a, the sensor 30, 30a can still securely contact the heat sink 20, 20a even though the adhering force offered by the thermal adhesive becomes weaken after a period of use of the sensor 30, 30a. Therefore, a risk that the sensor 30, 30a is loosened or even falls off from the heat sink 20, 20a is eliminated, and the sensor 30, 30a can output the signal correctly reflecting the real-time temperature of the electronic component.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipating device comprising:
    a heat sink;
    a temperature sensor mounted on the heat sink, adapted for detecting a temperature of an electronic component in thermal connection with the heat sink; and
    a locking device for securing the sensor on the heat sink, comprising:
        a tab resiliently pressing the sensor against the heat sink; and
        a pair of members connecting with the tab and secured on the heat sink, the pair of members being attached to a same surface of the heat sink on which the sensor is mounted.

2. The heat dissipating device as claimed in claim 1, wherein the pair of members are made integrally with the tab.

3. The heat dissipating device as claimed in claim 2, wherein the pair of members are rectangular and planar, fasteners extending through the pair of members into the heat sink.

4. The heat dissipating device as claimed in claim 1, wherein one of the pair of members is a support seat pivotably connected to the tab.

5. The heat dissipating device as claimed in claim 4, wherein the support seat consists of a bended sheet and a pair of rings extending curvedly from the sheet, the sheet being fixed to and contacting the surface of the heat sink at a side of the temperature sensor.

6. The heat dissipating device as claimed in claim 5, wherein an end of the tab is bended downwardly to form an arced hem fittingly received between the pair of rings of the support seat.

7. The heat dissipating device as claimed in claim 6, wherein a pin extends through the hem and the pair of rings to pivotedly connect the tab and the support seat.

8. The heat dissipating device as claimed in claim 1, wherein another one of the pair of members is a catch clasping the tab.

9. The heat dissipating device as claimed in claim 8, wherein the catch comprises a bended flake and a barb extending downwardly from the flake, the flake being fixed on the surface of the heat sink at an opposite side of the temperature sensor.

10. The heat dissipating device as claimed in claim 9, wherein an opposite end of the tab defines an opening therein, the barb of the catch being engaged in the opening to lock with the tab.

11. The heat dissipating device as claimed in claim 1, wherein the tab comprises a baffle and a pair of arms extending outwardly from two opposite extremity ends of the baffle, the baffle being curved to abut against the sensor.

12. The heat dissipation device as claimed in claim 1, wherein the heat sink comprises a base and a plurality of fins, the base comprising a first face and an opposite second face, the fins extending outwardly from the first face of the base, the second face being adapted for contacting the electronic component, the pair of members and the temperature sensor being attached to the second face of the base.

13. A locking device for securing a temperature sensor on a heat sink, comprising:
   a first portion for pressing the sensor against the heat sink; and
   a pair of second portions coupling with the first portion and for being secured on the heat sink, wherein at least a part of the first portion is curved conforming a profile of the sensor, the pair of second portions being substantially planar and coplanar with each other.

14. The locking device as described in claim 13, wherein the first portion and the pair of second portions are formed integrally with each other.

15. The locking device as described in claim 13, wherein the first portion and at least one of the pair of second portions are detachable from each other.

16. The locking device as described in claim 15, wherein the first portion is pivotably attached to one of the pair of second portions.

17. The locking device as described in claim 16, wherein the first portion is separably lockable with another one of the pair of second portions.

18. The locking device as described in claim 13, wherein the first portion is connected between the pair of second portions.

* * * * *